United States Patent
Egelmeers et al.

(10) Patent No.: US 7,171,436 B2
(45) Date of Patent: *Jan. 30, 2007

(54) PARTITIONED BLOCK FREQUENCY DOMAIN ADAPTIVE FILTER

(75) Inventors: Gerardus Paul Maria Egelmeers, Eindhoven (NL); Rene Martinus Maria Derkx, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 870 days.

This patent is subject to a terminal disclaimer.

(21) Appl. No.: 09/930,679

(22) Filed: Aug. 15, 2001

(65) Prior Publication Data
US 2002/0106016 A1    Aug. 8, 2002

(30) Foreign Application Priority Data
Aug. 21, 2000   (EP)   ................. 00202916

(51) Int. Cl.
    *G06F 7/10*    (2006.01)
(52) U.S. Cl. .................................... 708/322
(58) Field of Classification Search ........... 708/300, 708/319, 320, 322, 323
See application file for complete search history.

(56) References Cited

U.S. PATENT DOCUMENTS

| | | | | |
|---|---|---|---|---|
| 4,658,426 A | * | 4/1987 | Chabries et al. | 381/94.3 |
| 5,416,845 A | * | 5/1995 | Qun | 381/71.12 |
| 5,524,149 A | * | 6/1996 | Frenzel | 379/379 |
| 5,796,814 A | * | 8/1998 | Brajal et al. | 375/232 |
| 5,889,869 A | * | 3/1999 | Botros et al. | 381/71.11 |

OTHER PUBLICATIONS

By J.S. Soo and K.K. Pang "Multidelay Block Frequency Domain Adaptive Filter", IEEE Transactions on Acoustics, Speech and Signal Processing, vol. 38, No. 2, pp. 373-376.

* cited by examiner

*Primary Examiner*—Chuong D Ngo

(57) ABSTRACT

The partitioned block frequency domain adaptive filter according to the invention comprises a plurality of parallel arranged filter partitions. Each filter partition models a part of an impulse response of the adaptive filter and has update means for updating filter coefficients of that filter partition by means of a circular convolution. The update means intermittently constrain these filter coefficients by eliminating circular wrap-around artifacts of the circular convolution. The update means comprise selection means for selecting and removing at least part of the circular wrap-around artifacts. The selection means can be implemented with a relatively low computational complexity by means of an approximation of a rectangular constraint window.

21 Claims, 13 Drawing Sheets

PARTITIONED BLOCK FREQUENCY DOMAIN ADAPTIVE FILTER

The invention relates to a partitioned block frequency domain adaptive filter for filtering an input signal in dependence on a control signal, the adaptive filter comprising a plurality of parallel arranged filter partitions, each filter partition being arranged for modeling a part of an impulse response of the adaptive filter, each filter partition having update means for updating filter coefficients of that filter partition by circular convoluting a signal representative of the input signal and a signal representative of the control signal, the update means comprising constraint means for intermittently constraining the filter coefficients by eliminating circular wrap-around artifacts of the circular convolution.

The invention further relates to an acoustic echo canceller comprising such a partitioned block frequency domain adaptive filter and to a method of adaptively filtering an input signal in dependence on a control signal.

Figure 1:
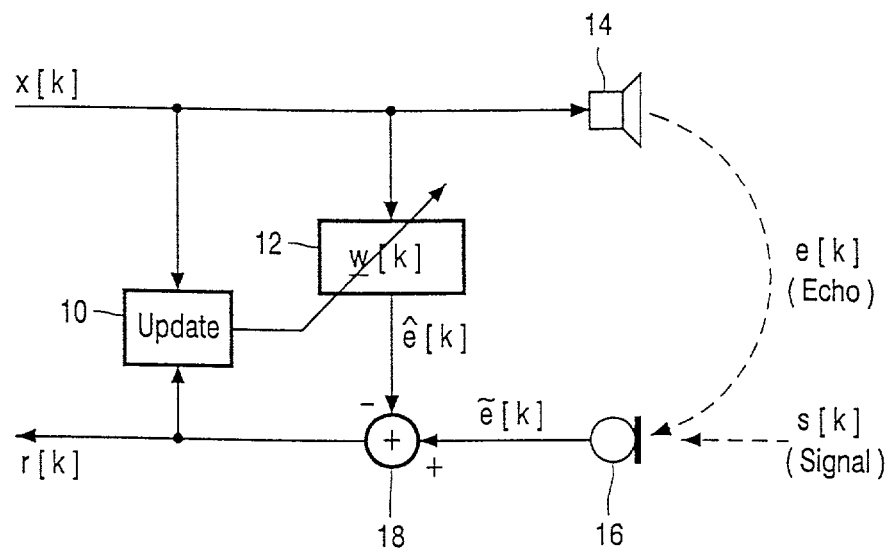
Figure 8:
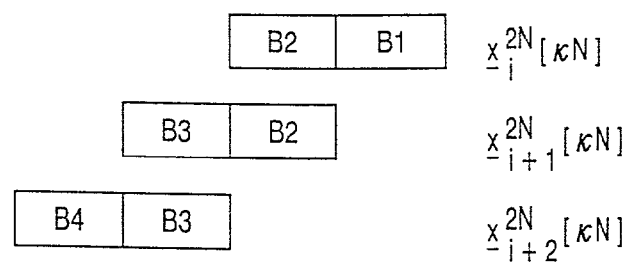

A partitioned block frequency domain adaptive filter (PBFDAF) according to the preamble is known from the paper "Multidelay block frequency domain adaptive filter", IEEE Transactions on Acoustics, Speech and Signal Processing, vol. 38, no. 2, pp. 373–376, by J. S. Soo and K. K. Pang. Adaptive filters can be very useful devices in several applications of digital signal processing. Examples of such applications are: channel equalization, array signal processing and noise and echo cancellation. Here, the Acoustic Echo Canceller (AEC) is merely used as a means for demonstrating the invention, and it is noted that the invention is not restricted to this specific application. Acoustic Echo Cancellers are used, for example, in teleconferencing systems or in speech recognition systems. The structure of an AEC is depicted in FIG. 1 and will be explained as part of a teleconferencing system.

In a teleconferencing system with two speakers in two different rooms, an AEC is implemented twice. The speech signal from the far-end speaker x[k] is generated in the near-end room by the loudspeaker 14. The transmission between the loudspeaker 14 and the microphone 16 can be modeled by a room impulse response. The echo signal e[k], picked up by the microphone 16, can be seen as a convolution of the signal x[k] with this room impulse response. In the case that both parties are speaking (i.e. double-talk), the microphone 16 also picks up a near-end speech signal s[k]. If there was no adaptive filter present, the signal $$\bar{e}[k]=e[k]+s[k]$$

would be directly passed on to the far-end speaker. Besides the wanted near-end speech signal, the far-end speaker also hears echoes of his own speech signal. For the overall teleconferencing system, this results in a non-optimal communication between the two speakers.

The adaptive filter, which is formed by the update means or correlation means 10 and the convolution means 12, reduces these unwanted echoes by modeling the real room impulse response with a Finite Impulse Response (FIR) filter. The filter-coefficients or filter-weights w[k] of this FIR filter are updated in the update means 10 by correlating the residual signal r[k] with the input signal x[k]. By convoluting or convolving the input signal x[k] with the filter-coefficients w[k] in the convolution means 12, the adaptive filter estimates the unknown acoustic echo signal e[k], indicated by ê[k]. This estimate of the echo is subtracted from the real echo by means of a subtractor 18. As a result, the echo level is reduced, leading to improved communication between the speakers.

For efficient implementations of adaptive filters, it is known to use block signal processing in combination with Fast Fourier Transforms (FFTs) for performing fast convolution (filtering) which permits adaptation of filter parameters in the frequency domain in a computationally efficient manner. To do this, a block of input-samples is collected and the adaptive filtering is performed in frequency-domain. Commonly, Fast Fourier Transforms (FFTs) are used to calculate the frequency-domain data from the time-domain data although it is noted that also other transforms (e.g. (I)DCT transformations) can be used for this purpose.

An elementwise multiplication of two frequency-domain vectors corresponds to a convolution in the time-domain. If both vectors are transformed with the Fast Fourier Transform this convolution is a circular convolution. In adaptive filtering linear convolutions in stead of circular convolutions are needed to convolve an infinite length input data stream with a finite length vector. By means of the so-called Overlap-Save (OLS) method a linear convolution can be performed using FFT/IFFTs. It is noted that the Overlap-Add (OLA) method can also be used for efficiently convolving an infinite length vector with a finite length vector. However, adaptive filters using the OLS are usually less computational complex than adaptive filters that use the OLA method.

An adaptive filter comprises a linear correlation part 10 and a linear convolution part 12. The convolution part 12 is needed for filtering an input signal with the filter-weights, while the correlation part 10 calculates a gradient estimation needed to update these adaptive filter-weights. After convergence the adaptive weights have adjusted to the optimum solution and represent the room impulse response. The correlation part 10 and the convolution part 12 may both be implemented by means of the Overlap-Save method. The correlation part 10 is similar to the convolution part 12 in that in both parts a linear convolution is calculated. The correlation part 10 differs from the convolution part 12 in that in the correlation part 10 one input block has to be mirrored in time. This mirroring in time can be performed in frequency domain by means of a complex conjugate operator 32 as shown in FIG. 2.

A drawback of (50% overlap) block frequency domain adaptive filters (BFDAFs) is the delay of N samples due to the block processing. First a complete block with input samples is collected, before the block can be processed. This problem is solved in PBFDAFs where this block size is reduced by partitioning of the adaptive filter. A PBFDAF can be seen as a parallel implementation of a number of BFDAFs which all model a small part of the impulse response. The convolution result is obtained by adding the results of all the convolutions.

Figure 2:
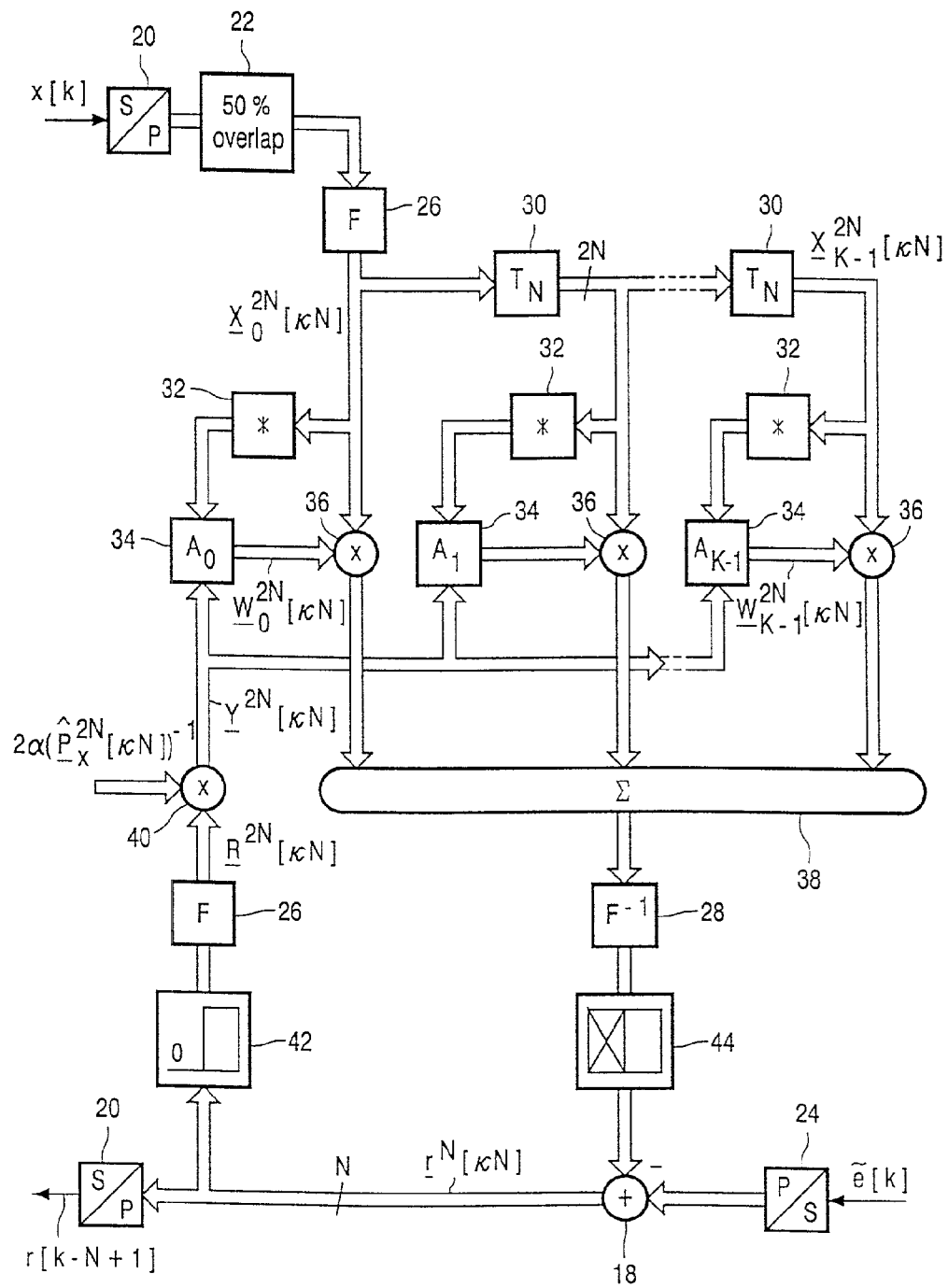

FIG. 2 shows a block diagram of a PBFDAF. Samples of the input signal x[k] are collected into blocks with 50% overlap by means of the serial to parallel converter 20 and the 50% overlap block 22. These blocks of input samples are then converted into the frequency domain by a FFT 26. In block 42 N zeros are appended on the left of a block of N samples of the residual signal or control signal r[k]. The resulting block of 2N time domain values is thereafter converted into the frequency domain by another FFT 26. Next, the power of this frequency domain signal is normalized by means of an elementwise multiplication with a normalization factor in an elementwise multiplier 40.

Each partition comprises a complex conjugate operator 32, an update block 34 and an elementwise multiplier 36. Additionally, all partitions with the exception of the leftmost partition, comprise a block delay element 30. The update means or correlation means 10 comprise the complex conjugate operator 32 and the update block 34. The convolution means 12 comprise the elementwise multiplier 36. The output of the complex conjugate operator 32 is the signal representative of the input signal. The output of the elementwise multiplier 36 is the signal representative of the control signal. The update block 34 updates and outputs the filter coefficients on the basis of the signal representative of the input signal and the signal representative of the control signal. Next, the updated filter coefficients are convoluted with blocks of samples of the input signal by means of the elementwise multiplier 36. The outputs of the elementwise multipliers 36 of all the partitions, i.e. the results of all the partial convolutions, are added together in an adder 38 in order to form the overall convolution result. This overall convolution result is then transformed into the time domain by means of an IFFT 28. Finally, the left-most N samples of the block of 2N time domain samples of the overall convolution result are discarded in order to form the estimated echo signal ê[k]. This estimated echo signal is subtracted from the signal picked up at the near end by means of subtractor 18. The result of this subtraction is the residual signal r[k].

Figure 3:
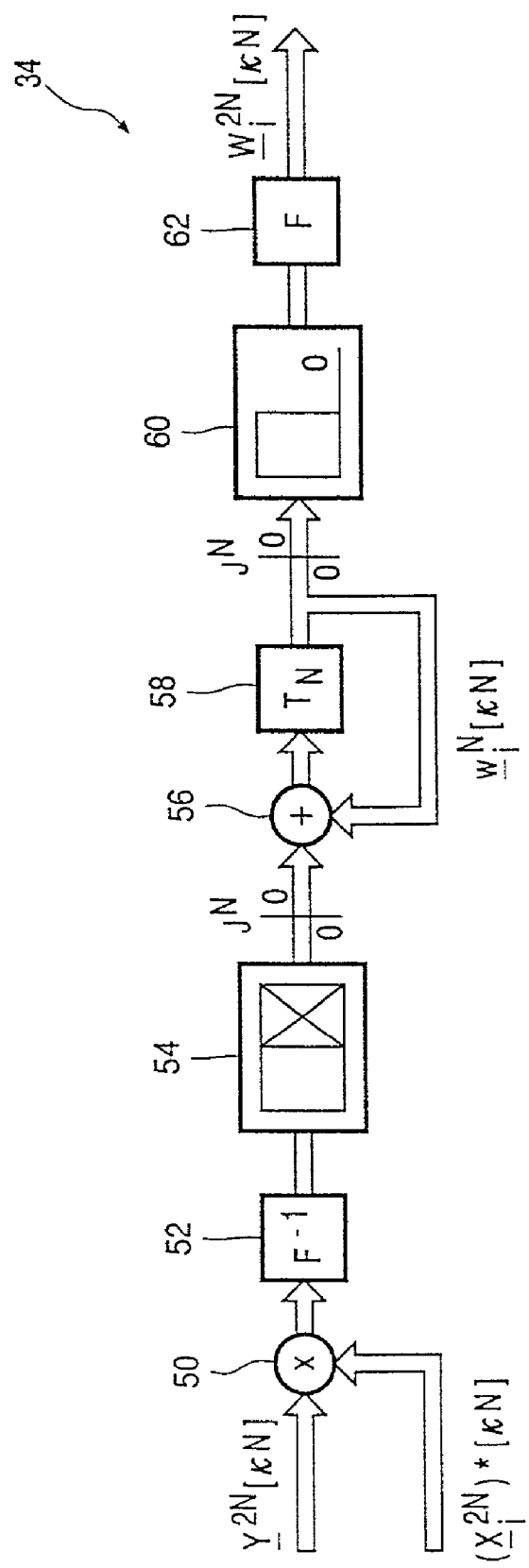

FIG. 3 shows a block diagram of an embodiment of the update block 34. In this embodiment the adaptive weights are stored in time-domain. Note that the index i indicates the partition number. Furthermore, the following variable $\underline{W}_i^{2N}$ is defined as:

$$\underline{W}_i^{2N}[\kappa N] = \bar{F}\begin{pmatrix} I^N \\ O^N \end{pmatrix} J^N \underline{w}_i^N[\kappa N]. \quad (3.1)$$

The signal representative of the input signal and the signal representative of the control signal are elementwise multiplied with each other by elementwise multiplier 50. This elementwise multiplication in frequency domain constitutes a circular convolution in time domain. The result of this convolution comprises circular wrap-around artifacts which are removed by means of a rectangular time domain constraint window which is formed by IFFT 52, element disposal window 54, zero appender 60 and FFT 62. First, the convolution result is transformed into the time-domain by the IFFT 52. Next, the window 54 discards N points of the convolution result. This is needed to remove the circular wrap-around artifacts from the Overlap-Save method. The remaining N samples are used to update the adaptive weights with the adder 56 and the delay element 58. After this update, N zeros are augmented. This is needed for the efficient convolution of the adaptive weights with the input signal, by means of the Overlap-Save method. Finally, the result is transformed back to frequency-domain.

Figure 4:
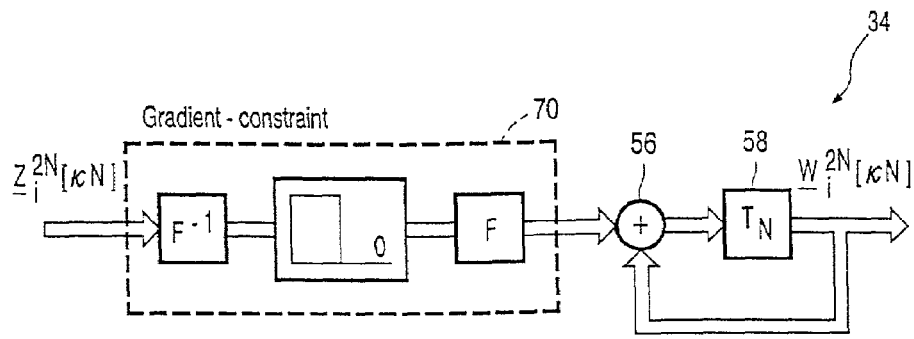

The two mirroring operators $J^N$ can be eliminated by storing the vector $$\underline{w}_i^{2N}[\kappa N]$$

in time-reverse order. Furthermore, the two time-domain windows, the FFT and the IFFT, can be combined in a time-domain gradient constraint operator. As a consequence of the gradient constraint operator or constraint operator, the adaptive coefficients need to be stored and up-dated in frequency domain instead of time-domain. These frequency-domain coefficients will be denoted by $\underline{W}_i^{2N}$. The separation of the constraint operator and the adaptive coefficients can be illustrated by the following deduction:

$$\underline{W}_i^{2N}[(\kappa+1)N] = \bar{F}\begin{pmatrix} I^N \\ O^N \end{pmatrix} J^N(\underline{w}_i^N[\kappa N] + J^N(I^N \ O^N)\bar{F}^{-1}\underline{Z}_i^{2N}[\kappa N]) \quad (3.2)$$

$$= \underline{W}_i^{2N}[\kappa N] + \bar{F}\begin{pmatrix} I^N \\ O^N \end{pmatrix}(I^N \ O^N)\bar{F}^{-1}\underline{Z}_i^{2N}[\kappa N]$$

$$= \underline{W}_i^{2N}[\kappa N] + \bar{F}\begin{pmatrix} I^N & O^N \\ O^N & O^N \end{pmatrix}\bar{F}^{-1}\underline{Z}_i^{2N}[\kappa N]$$

$$= \underline{W}_i^{2N}[\kappa N] + \bar{F}\, G^{2N\times 2N}\bar{F}^{-1}\underline{Z}_i^{2N}[\kappa N].$$

where $$\mathrm{diag}\{G^{2N\times 2N}\} = \underline{g}^{2N}$$

is the rectangular constraint window vector, containing ones in the first N elements and zeros in the last N elements. Here, this constraint window is referred to as the rectangular constraint window. The constraint means comprise this rectangular constraint window. FIG. 4 shows the frequency-domain coefficient update together with the rectangular constraint window.

It is to be noted that there are reasons for updating and storing the adaptive weights in frequency-domain, despite the fact that frequency-domain weights need more storage elements compared with the time-domain weights. The most important reason being the possibility to omit the gradient constraint, in order to reduce the computational complexity.

Figure 5:
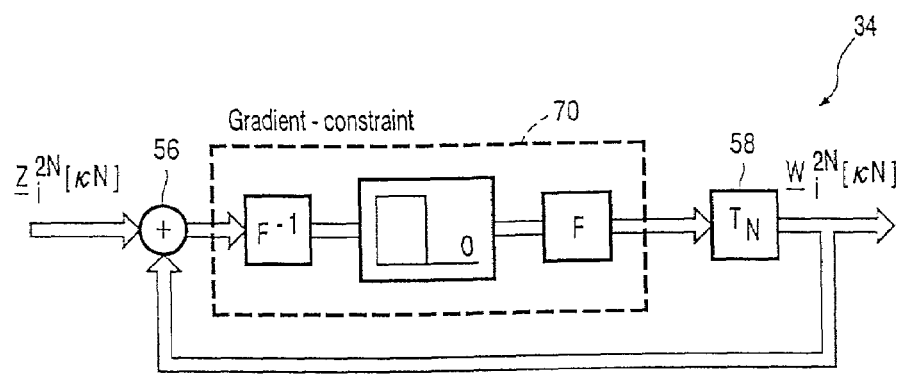

Mostly, the rectangular constraint is placed before the update, but it is advisable to place this constraint after the update as is shown in FIG. 5. Calculating the rectangular constraint with infinite precision gives results which are the same for both situations (FIGS. 4 and 5). However when calculating the weight update in FIG. 4 with finite precision (e.g. fixed-point arithmetic), numerical round-off errors are accumulated in the weight update. Eventually, after many iterations of the weight update, this leads to large errors in the last N points of the coefficients. Correction of these accumulated errors is prevented by the right half part of the constraint. When placing the constraint after the weight update as depicted in FIG. 5, the result after calculating the constraint also contains numerical round-off errors in cases of finite precision. However, as the constraint operation is performed on the actual coefficients, there is no accumulation of these errors which could lead to long-term problems. Hence, rectangular constraint operations are preferably placed after the weight update.

Figure 6:
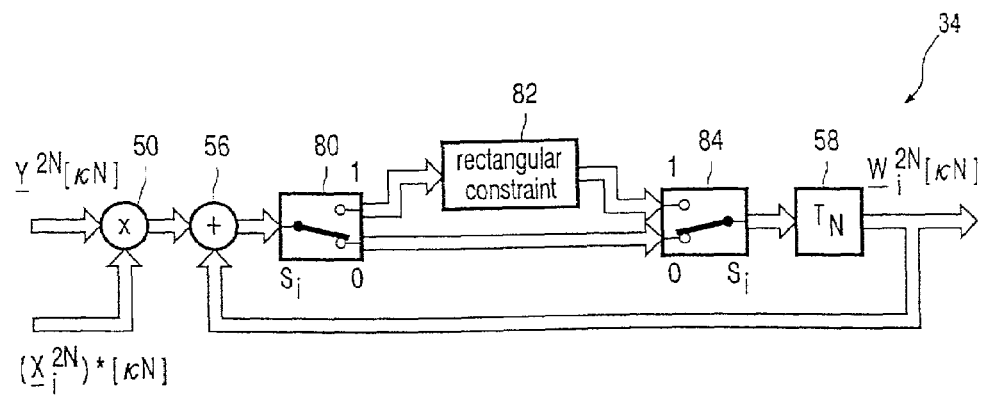

FIG. 6 shows a block diagram of an embodiment of the update block 34 which illustrates the operation of the PBFDAF which is disclosed in the above mentioned paper. The use of the rectangular constraint window 82 is computationally relatively complex. This complexity can be lowered by constraining the coefficient vector of a particular partition only once in a while. For this purpose the update block 34 comprises two switches 80 and 84. The operation of these switches 80 and 84 may be described by the following function:

$$S_i = \begin{cases} 1 & \text{if } \kappa \bmod KP = i \\ 0 & \text{otherwise.} \end{cases} \quad (3.6)$$

In this formula the parameter K indicates the number of partitions and the parameter P is the alternative constraining period in number of block iterations of the algorithm. The rectangular constraint window is calculated only when the switches 80 and 84 are both in the 1-position. When the switches 80 and 84 are both in the 0-position the convolution results are not constrained at all.

It is an object of the invention to provide a PBFDAF with an improved convergence behavior, while maintaining a relatively low computational complexity. This object is achieved in the PBFDAF according to the invention, which is characterized in that the update means further comprise selection means for selecting and removing at least part of the circular wrap-around artifacts, the selection means comprising an approximation of a rectangular constraint window. Because the constraining of the circular wrap-around artifacts is performed intermittently, i.e. only once in a while, it is possible that a too large accumulation of circular wrap-around artifacts takes place in between these constrainings, resulting in a relatively bad convergence behavior. This is prevented by applying an approximation of a rectangular constraint window for the purpose of selecting and removing at least part of the circular wrap-around artifacts. The approximation of the rectangular constraint window allows to eliminate a large part of the circular wrap-around artifacts in a computationally efficient way.

An embodiment of the PBFDAF according to the invention is characterized in that the selection means are arranged for selecting the at least part of the circular wrap-around artifacts when the filter coefficients are not constrained by the constraint means. By this measure the selection and removal of the at least part of the circular wrap-around artifacts is not performed when it has no use, i.e. on the moments that the circular wrap-around artifacts are eliminated anyway by the constraint means.

An embodiment of the PBFDAF according to the invention is characterized in that time domain values of the approximation are larger than or equal to zero. Negative values in the time-domain window need to be avoided in order to avoid divergence of the adaptive weights. The reason for the divergence in the case of negative values in the constraint window can be explained in an intuitive way. Because of the negative values, the correlation part produces results that are negatively correlated with the residual signal. Hence the adaptive weights are updated in the wrong direction. As the adaptive weights become less accurate, there is more negative correlation and worsening of the weights in every next block-iteration.

An embodiment of the PBFDAF according to the invention is characterized in that the approximation in time domain has substantially high slopes near the positions which correspond to the positions of the transitions in a rectangular constraint window. By this measure, a relatively large amount of the circular results that converge to a non-zero value is eliminated by the selection means. For example, when using a 50% overlap, the high slopes should be positioned at 0 and N, with N being the block size of the filter and 2N being the FFT size. When using a 75% overlap, the high slopes should be positioned at 0 and 3N, with N being the block size of the filter and 4N being the FFT size.

An embodiment of the PBFDAF according to the invention is characterized in that frequency domain values of the approximation each comprise a real value and complex conjugate imaginary values, whereby at least part of the imaginary values form a row of numbers, the numbers being obtainable from one another by multiplication. By this measure, at least part of the frequency domain values of the approximation can easily be calculated, i.e. merely by multiplying other frequency domain values with a multiplication factor, resulting in a PBFDAF with a relatively low computational complexity.

An embodiment of the PBFDAF according to the invention is characterized in $$(G^{2N})_i = \begin{cases} 2N \cdot a & \text{for } i = 0 \\ 0 & \text{for } 0 < i < 2N, i \text{ even} \\ -\dfrac{2N \cdot a}{2}\left(m^{-\left(\frac{i-1}{2}\right)} - m^{-\left(\frac{2N-1-i}{2}\right)}\right)j & \text{for } 0 \le i < 2N, i \text{ odd} \end{cases}$$

that the frequency domain values of the approximation are defined as: with i being an index number, m being a multiplication factor, a being a mean value. Because of the relation between two subsequent frequency components in this constraint-window, the frequency domain circular-convolution of this window with a complex valued Hermitian signal can be calculated in a very efficient way.

Figure 12:
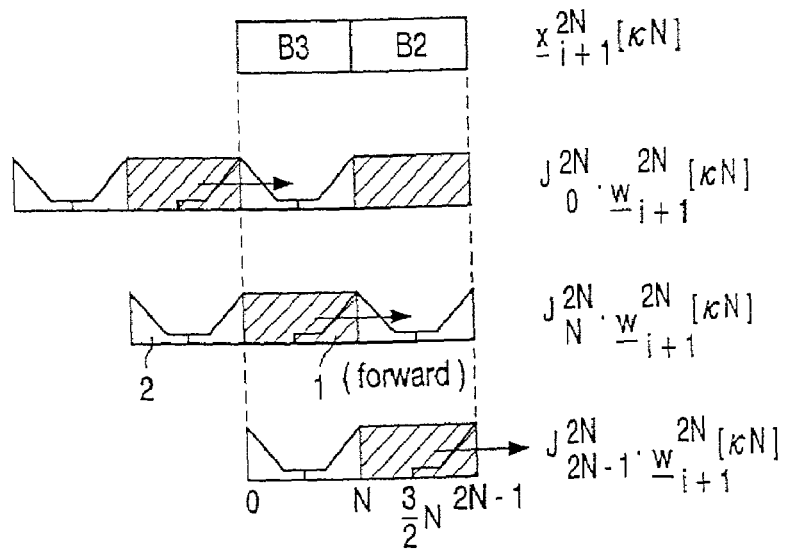
Figure 13:
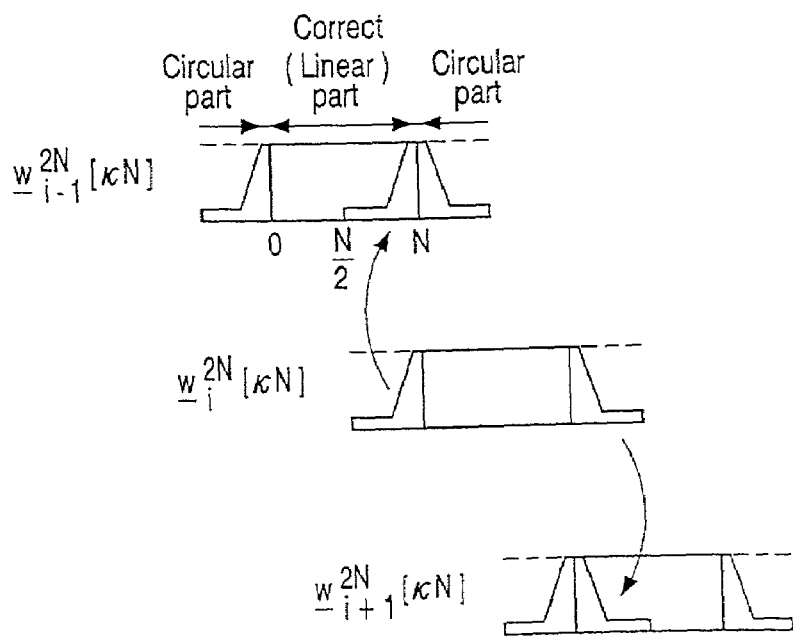
Figure 14:
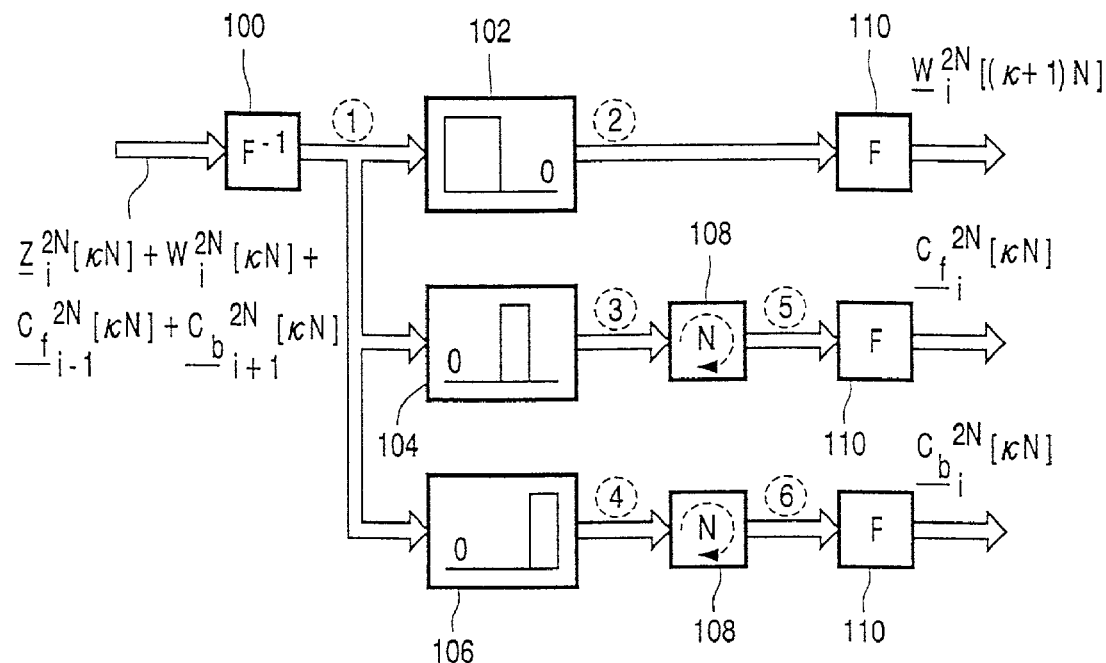
Figure 15:
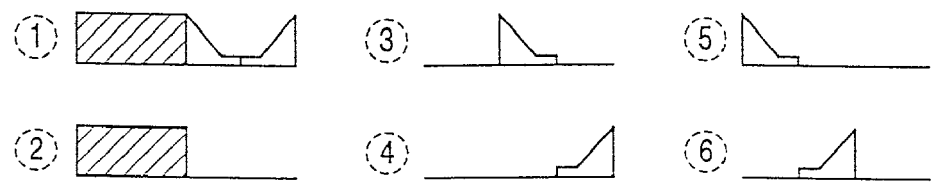
Figure 16:
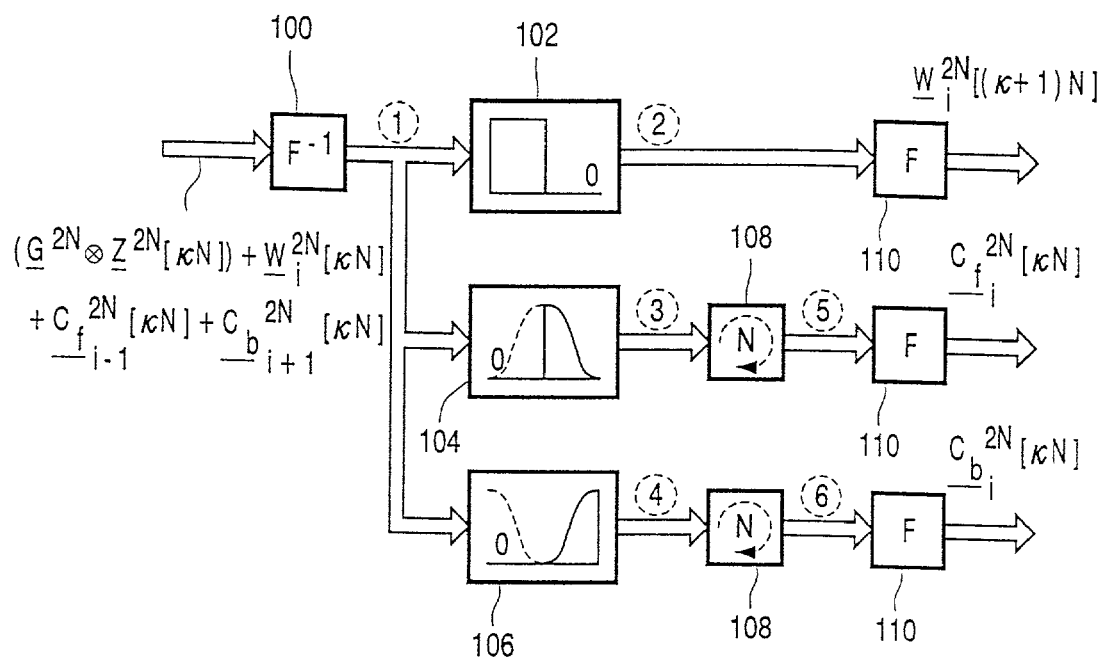
Figure 17:
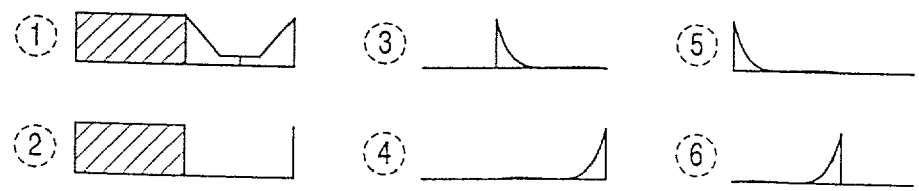
Figure 18:
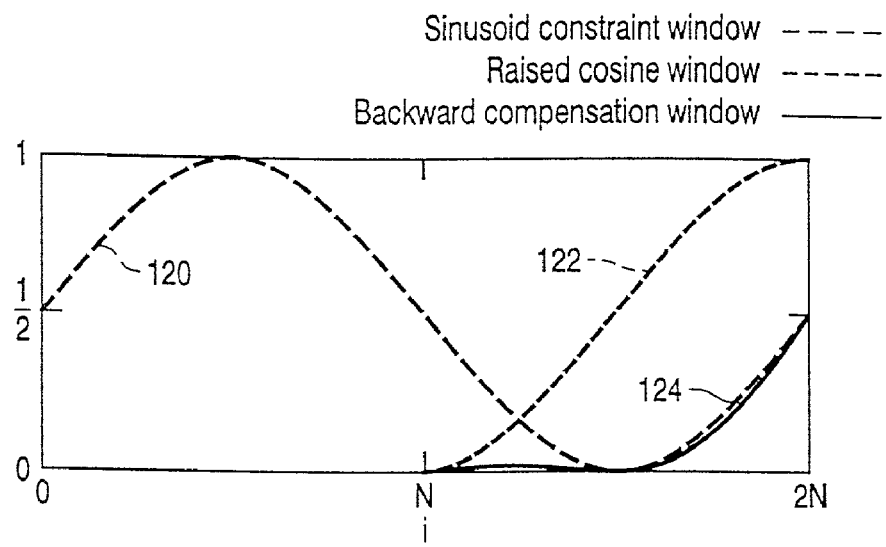
Figure 19:
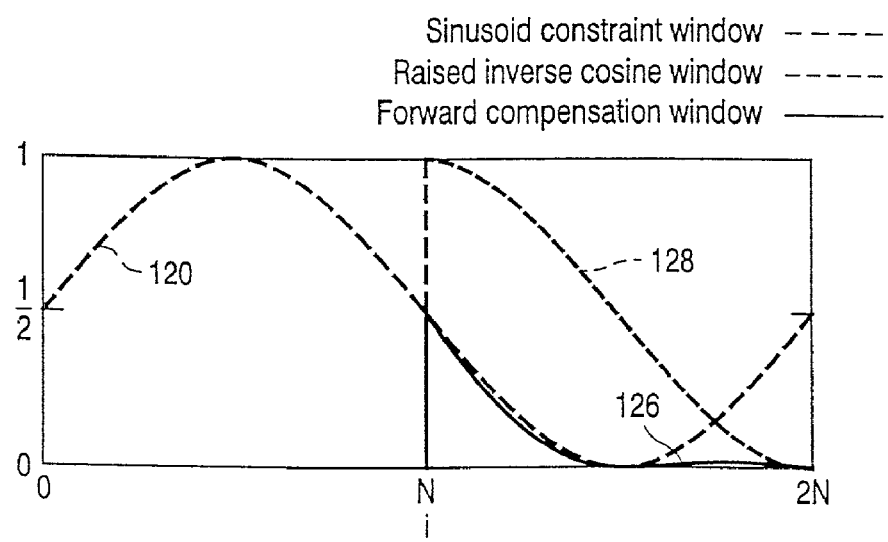
Figure 20:
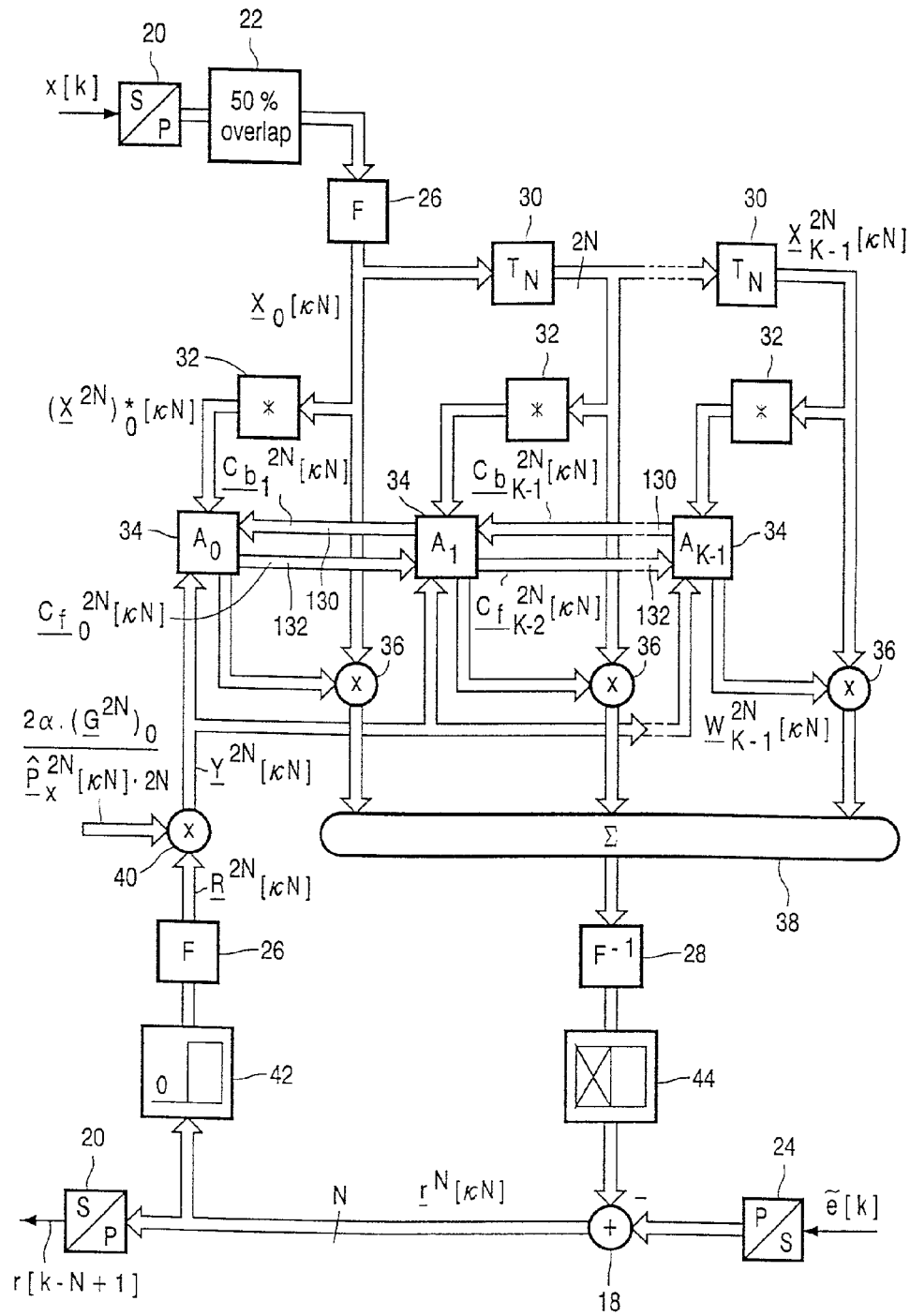
Figure 21:
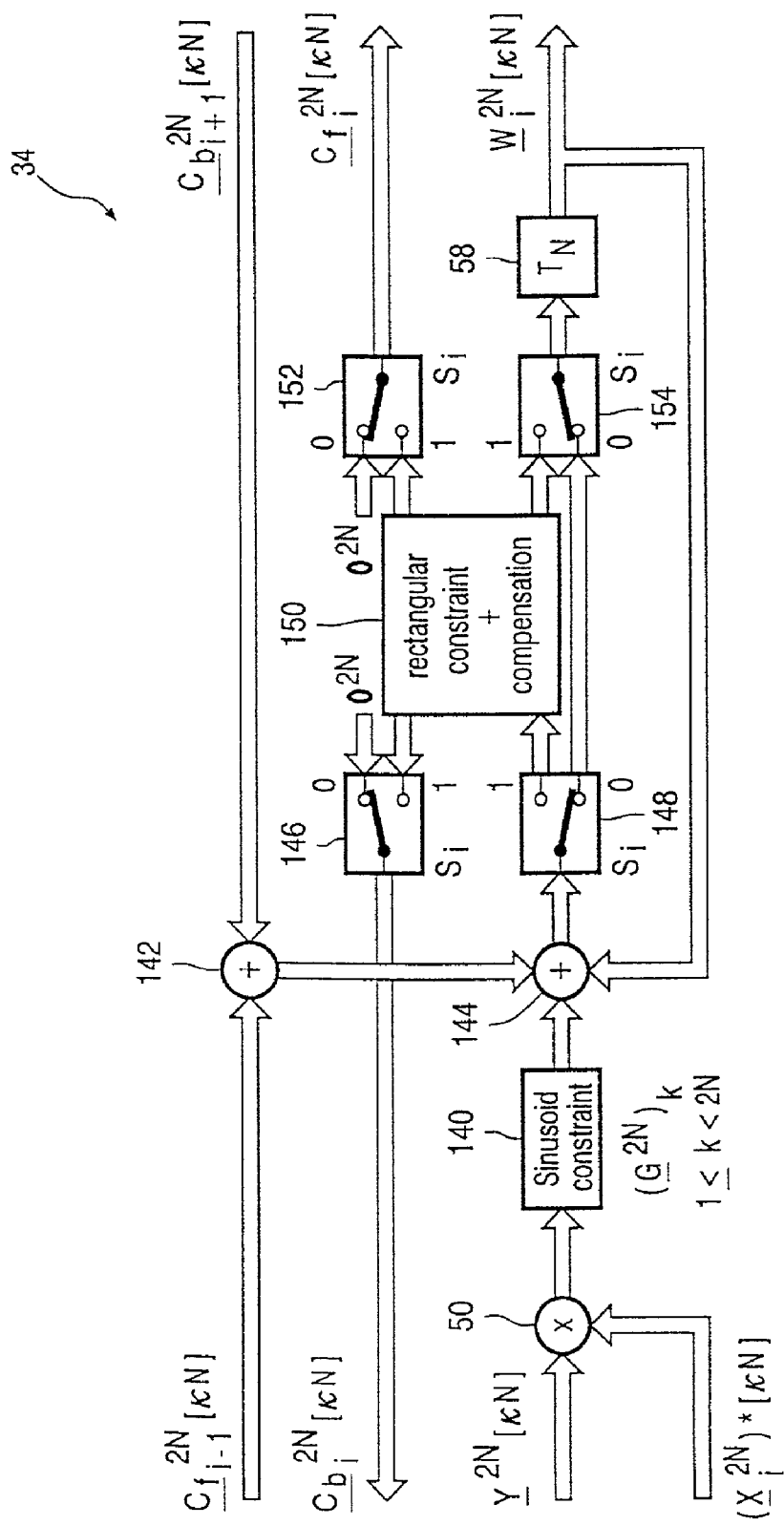
Figure 22:
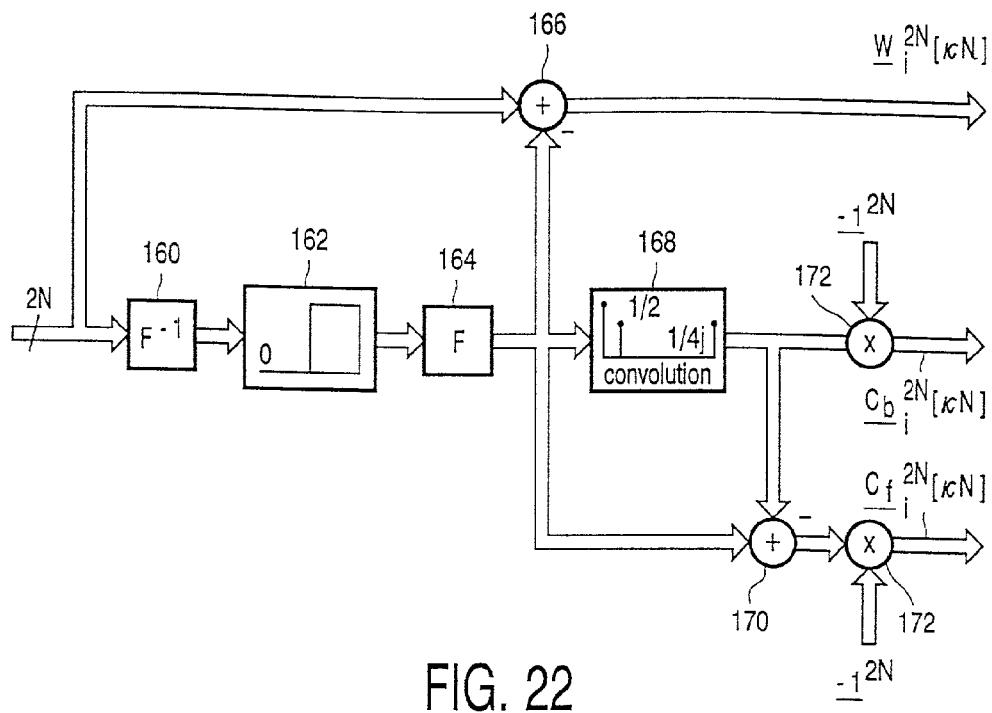
Figure 23:
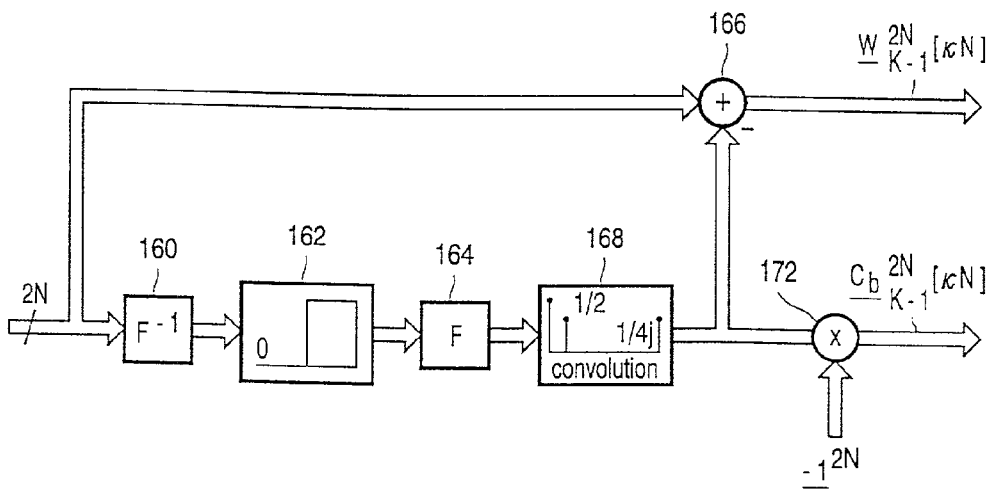

The above object and features of the present invention will be more apparent from the following description of the preferred embodiments with reference to the drawings, wherein:

FIG. 1 shows a block diagram of an embodiment of the acoustic echo canceller, FIG. 2 shows a block diagram of an embodiment of a PBFDAF comprising an update block 34, FIGS. 3 to 7 show block diagrams of embodiments of the update block 34, FIGS. 8 to 13 show diagrams by means of which the compensation of circular wrap-around artifacts in the PBFDAF according to the invention is illustrated, FIG. 14 shows a block diagram of an embodiment of a generator means for generating forward and backward compensation signals, FIG. 15 shows some signal diagrams by means of which the operation of the generator means as shown in FIG. 14 is explained, FIG. 16 shows a block diagram of another embodiment of a generator means for generating forward and backward compensation signals, FIG. 17 shows some signal diagrams by means of which the operation of the generator means as shown in FIG. 16 is explained, FIGS. 18 and 19 show some signal graphs illustrating the operation of the generator means, FIG. 20 shows a block diagram of an embodiment of a PBFDAF according to the invention, FIG. 21 shows a block diagram of an embodiment of the update block 34 for use in the PBFDAF of FIG. 20, FIG. 22 shows a block diagram of a further embodiment of a generator means for generating forward and backward compensation signals, FIG. 23 shows a block diagram of an embodiment of a generator means for generating a backward compensation signal.

In the Figures, identical parts are provided with the same reference numbers.

In the Figures and in this description uppercase symbols are used to denote frequency-domain variables and lowercase symbols for time-domain variables. A boldface font is used to denote matrices, while vectors are denoted by underlining fonts. Furthermore the superscripts t, * and h are used to denote the transpose, complex conjugate and the complex conjugate transpose (Hermitian) respectively. $O^N$ and $I^N$ represent a zero and identity matrix, the superscript indicating the dimension of the matrix. Generally, superscripts indicate the dimension and subscripts indicate the element number of the vector or matrix. As most of the vectors and matrices used here have dimension 2N×1 and 2N×2N, a vector or matrix with omitted superscript indicates a vector of length 2N or a matrix with dimension 2N×2N. The indices between square brackets (e.g. x[k]), indicate a time-index. diag {.} denotes the operator that transforms a 2N×1 vector into a 2N×2N matrix containing the vector coordinates as diagonal elements while other elements are zero. The mathematical expectation is denoted by $\epsilon\{\cdot\}$.

A circular shift of the data over L positions in an 2N dimensional vector is carried out by the matrix:

$$D_L^{2N} = \begin{pmatrix} O & I^{2N-L} \\ I^L & O \end{pmatrix}, \quad (1.1)$$

which the zero matrices O have appropriate dimensions. Note that $D_0^{2N} = I^{2N}$.

The data of an 2N dimensional vector can be mirrored with the 2N×2N mirrored matrix $J^{2N}$ that is defined as:

$$J^{2N} = \begin{pmatrix} O & & 1 \\ & \cdot^{\cdot^{\cdot}} & \\ 1 & & O \end{pmatrix}. \quad (1.2)$$

A reverse circular shift over L positions, in opposite direction to $D_L^{2N}$ is carried out by the matrix $$J_L^{2N} = \begin{pmatrix} J^L & O \\ O & J^{2N-L} \end{pmatrix}. \quad (1.3)$$

Note that $J_0^{2N} = J^{2N}$.

Besides mathematical descriptions also figures based on signal processing blocks are used. The explanation of these blocks is appended to the description. There also an overview is given of the symbols used. It is to be noted that although in this description only 50% overlap or Half Overlap (HOL) of block-data is used, the invention is not limited to this specific implementation of overlap. The invention can also be used with other overlap percentages.

The Normalized Mean Square Error (NMSE), in dB, is a performance measure of adaptive filters and is defined as follows:

$$NMSE[k] = 10 \cdot \log \frac{\sum_{i=0}^{N} (e_i[k] - \hat{e}_i[k])^2}{\sum_{i=0}^{N} (e_i[k])^2}, \quad (1.7)$$

where N is the length of the block that contains the residual samples for which we calculate the NMSE[k]. The steady-state NMSE is the value of the NMSE after convergence of the adaptive filter, and is a measure of the residual echo. The lower the steady-state NMSE, the better the performance of the adaptive filter.

The CTC, which is another performance measure of adaptive filters, is defined as the slope of the NMSE curve, during the transient of the algorithm. It assumes that the initial part of the learning curve is linear. The CTC is defined in dB/ms.

An IFFT and FFT operation and an elementwise multiplication are needed to calculate the constraint in order to null half of the coefficients in time-domain. This requires O(N log N)

operations, where 2N is the length of the FFT/IFFT. This constraint can also be performed by calculating a circular convolution directly in frequency-domain. The straightforward calculation of the circular convolution requires $O(N^2)$ operations. The frequency-domain coefficients $(\underline{G}^{2N})_i$ for the circular convolution with the rectangular constraint are:

$$(\underline{G}^{2N})_i = \begin{cases} 2N - \frac{1}{2} & \text{for } i = 0 \\ 0 & \text{for } 0 < i < 2N, i \text{ even} \\ \dfrac{-2N \cdot j}{2N \cdot \tan\left(\dfrac{\pi \cdot d}{2N}\right)} & \text{for } 0 < i < 2N, i \text{ odd} \end{cases} \quad (3.8)$$

When using a first order approximation, only use the real coefficient and the first two mutually complex conjugates are used. This results in a sinusoid constraint window that can be computed in frequency-domain with much less computational complexity than by means of an FFT/IFFT. Off course, also other low-order approximations of the rectangular constraint window could be used Constraint windows with other than 50% overlap (half overlap) contain frequency components that have both real and complex values. Hence such a calculation needs additional computational complexity compared with the 50% overlap windows. As mentioned before, in most practical cases half overlap constraint windows are used.

The rectangular constraints need to be placed after the update. This is however different for the constraint approximations. If the approximations were placed after the update, the time-domain adaptive weights would constantly be multiplied by the weights of the approximation window. As most of the weights in the approximation window are generally not equal to one, this would lead to adjustments of the weights in every block-iteration and the adaptive filter would not converge. Hence all constraint approximations are best applied before the update, e.g. before the adder 56.

Negative values in the time-domain window need to be avoided in order to avoid divergence of the adaptive weights. The reason for the divergence in the case of negative values in the constraint window can be explained in an intuitive way. Because of the negative values, the correlation part produces results that are negatively correlated with the residual signal. Hence the adaptive weights are updated in the wrong direction. As the adaptive weights become less accurate, there is more negative correlation and worsening of the weights in every next block-iteration.

As the frequency-domain coefficients of equation 3.8 result in time-domain coefficients that can be negative, we need to scale the frequency coefficients. Using more frequency components in the constraint approximation, results in better performance, but enlarges the computational complexity. To achieve an optimal performance with low computational complexity, it is investigated which properties of the constraint are important. Therefore we perform an experiment with two constraint windows.

Constraint window 1 includes the real and first 3 mutually complex conjugate components according to formula 3.8. A scaling by a factor 5/6 is applied in order to avoid negative values in the window. The second window contains the same gradient in the slope compared with the first window type, but is more accurate (with respect to the rectangular constraint window) in between the slopes. The step-size parameter $2\alpha$ is set to the value of 0.5/K. Both constraint approximation windows lead to a less accurate steady-state NMSE compared to the full-constrained case. The difference between the two approximation windows however do not differ very much. Apparently, the values in between the slopes are of little importance for the convergence behavior. This can be explained due to the fact that the time-domain adaptive weights in between the slopes are updated with random (noisy) values. Hence the weights do not converge and are zero in average. This is not true for the circular artifacts closer to the slope. The adaptive weights close to these slopes converge to a non-zero value and introduce errors in the convolution part of the PBFDAF algorithm, as the neighbor partitions are coupled. To eliminate as much of the circular results that converge to a non-zero value, high slopes should be created on the two places where there are transitions in the rectangular constraint window.

As high slopes are important for obtaining a good convergence behavior, as many frequency components as possible should be used. When using a regular circular convolution algorithm, incorporating more frequency components leads to a linear increase in computational complexity. Therefore a regular circular convolution algorithm should not be used.

An efficient method for convolving a signal with an approximation of the rectangular con-straint is by assuming that the odd frequency components in equation 3.8 are related with the neighbor odd components by a multiplicative factor. As this window also contains higher-order frequency components, the slope of this constraint approximation is very steep. Hence this window is called the high-slope constraint window. The high-slope $$(\underline{G}^{2N})_i = \begin{cases} 2N \cdot a & \text{for } i = 0 \\ 0 & \text{for } 0 < i < 2N, i \text{ even} \\ -\frac{2N \cdot a}{2}\left(m^{-\left(\frac{i-1}{2}\right)} - m^{-\left(\frac{2N-1-i}{2}\right)}\right)j & \text{for } 0 \leq i < 2N, i \text{ odd}. \end{cases} \quad (4.2)$$

constraint window $\underline{G}^{2N}$ in frequency domain for 50% overlap partitions is defined as: Because of the relation between two subsequent frequency components of this above defined constraint-window, the frequency domain circular-convolution of this window with a complex valued Hermitian signal can be calculated in a very efficient way.

Experiments have shown that good results can be obtained when the constraint-window $\underline{g}^{2N}$ in time domain qualifies the following conditions:
1. $(\underline{g}^{2N})_i \geq 0$, $\forall i$,
2. High-slope on i=0 and i=N.

From the experiments it follows that a steep transition on i=0 and i=N (i.e. high-slope) is of more importance than the nulling in the range $N \leq i < 2N$ By choosing m=2.166 and a=0.57, the high-slope constraint window $$\underline{g}^{2N} = \mathfrak{I}^{-1} \cdot \underline{G}^{2N}$$

just qualifies the first condition above, while maximizing the derivative of the slope in the middle, as proposed in condition 2. This optimal value of m is found experimentally. With the value a, the area between the zero level and the high-slope window can be adjusted. For a=0.57, the mean amplitude in the range $0 \leq i < N$ is normalized to 1.

To derive an efficient algorithm for convolving the high-slope window with the complex-valued Hermitian input-signal, we start with the definition of the circular-convolution:

$$\frac{1}{2N} \cdot (\underline{X}^{2N} \circledast \underline{G}^{2N})_k = \frac{1}{2N} \sum_{i=0}^{2N-1} (\underline{X}^{2N})_{(k-i) \bmod 2N} \cdot (\underline{G}^{2N})_i. \quad (4.3)$$

As the circular convolution is a linear operation, we can apply the superposition theorem and split up the circular convolution with $\underline{G}^{2N}$ into three parts:

$$\frac{1}{2N} \cdot (\underline{X}^{2N} \circledast \underline{G}^{2N})_k = \quad (4.4)$$
$$\frac{1}{2N} \cdot ((\underline{X}^{2N} \circledast a)_k + (\underline{X}^{2N} \circledast \underline{G}_1^{2N})_k + (\underline{X}^{2N} \circledast \underline{G}_2^{2N})_k),$$

where:

$$\frac{1}{2N} \cdot (\underline{X}^{2N} \circledast \underline{G}_1^{2N})_k = \sum_{i=0, i \text{ odd}}^{2N-1} \left((\underline{X}^{2N})_{(k-i) \bmod 2N} \cdot \frac{-a}{2} \cdot m^{-\left(\frac{i-1}{2}\right)}\right)j \quad (4.5)$$

$$\frac{1}{2N} \cdot (\underline{X}^{2N} \circledast \underline{G}_2^{2N})_k = \sum_{i=0, i \text{ odd}}^{2N-1} \left((\underline{X}^{2N})_{(k-i) \bmod 2N} \cdot \frac{a}{2} \cdot m^{-\left(\frac{2N-1-i}{2}\right)}\right)j. \quad (4.6)$$

As there is a direct relation between formula 4.5 and formula 4.6, we only need to calculate one of these circular convolutions in the algorithm. This relation between the two formulas is expressed in the following lemma:

Lemma 4.2.1 If $(\underline{G}_2^{2N})_k = (\underline{G}_1^{2N})^*_{2N-k}$ and $(\underline{X}^{2N})_k = (\underline{X}^{2N})^*_{2N-k}$ (i.e. $\underline{X}^{2N}$ Hermitian), then:

$$(\underline{X}^{2N} \circledast \underline{G}_2^{2N})_k = (\underline{X}^{2N} \circledast \underline{G}_1^{2N})^*_{2N-k}. \quad (4.7)$$

Hence, in the next derivation of the algorithm, we only consider the circular convolution of formula 4.5. Because each next convolution-element $$(\underline{G}_1^{2N})_{k+2}$$

can be expressed as a function of the actual convolution-element $$(\underline{G}_1^{2N})_k,$$

a very efficient convolution algorithm can be derived. The iterative expression is formulated in the following lemma:

Lemma 4.2.2 If $\underline{G}_1^{2N} = \begin{cases} 0 & \text{for } 0 \leq i < 2N, i \text{ even} \\ -\dfrac{2N-a}{2} \cdot m^{-\left(\frac{i-1}{2}\right)} & \text{for } 0 \leq i < 2N, i \text{ odd} \end{cases}$ and $(\underline{X}^{2N})_k = (\underline{X}^{2N})^*_{2N-k}$ (i.e. $\underline{X}^{2N}$ Hermitian), then:

$$\frac{1}{2N} \cdot (\underline{X}^{2N} \circledast \underline{G}_1^{2N})_{k+2} = \quad (4.8)$$

$$m^{-1}\left(\frac{1}{2N} \cdot (\underline{X}^{2N} \circledast \underline{G}_1^{2N})_k - (\underline{X}^{2N})_{k+1} \cdot \frac{a}{2} \cdot (m - m^{-(N-1)})j\right).$$

On a similar way as the above derivation, we can derive an expression for calculating a convolution element $$(\underline{G}_2^{2N})_{k-2}$$

as a function of the convolution element $$(\underline{G}_2^{2N})_k.$$

This results in the following expression:

$$\frac{1}{2N} \cdot (\underline{X}^{2N} \circledast \underline{G}_2^{2N})_{k-2} = \quad (4.9)$$

$$m^{-1}\left(\frac{1}{2N} \cdot (\underline{X}^{2N} \circledast \underline{G}_2^{2N})_k + (\underline{X}^{2N})_{k-1} \cdot \frac{a}{2} \cdot (m - m^{-(N-1)})j\right).$$

Note that the above two expressions are numerically stable iterations, because of the multiplication with the factor $m^{-1}$. One can also derive an expression where in each iteration a multiplication with factor m is done; however, such an expression leads to less accurate results.

In order to calculate a convolution with the high-slope constraint in frequency-domain, we basically need to do the following sub-calculations:

1. Calculation of $$\frac{1}{2N} \cdot (\underline{X}^{2N} \circledast a)$$

(i.e scale operation),

2. Initial calculation of $$\frac{1}{2N} \cdot (\underline{X}^{2N} \circledast \underline{G}_1^{2N})_0 \text{ and } \frac{1}{2N} \cdot (\underline{X}^{2N} \circledast \underline{G}_1^{2N})_1,$$

3. Iterative calculation of the convolution by means of lemma 4.2.2.

4. Calculation of $$\frac{1}{2N} \cdot (\underline{X}^{2N} \circledast \underline{G}^{2N})_k$$

out-of the calculations above

The convolution with the mean-value a can be calculated by scaling the input-signal $\underline{X}^{2N}$ with the factor a. We note that when performing more than one circular convolution with the high-slope constraint window (as is the case in the PBFDAF algorithm), this convolution with the mean-value $$(2N)^{-1} \cdot (\underline{G}^{2N})_0$$

can be performed at the cost of only 1 multiplication.

The calculation of $$\frac{1}{2N} \cdot (\underline{X}^{2N} \circledast \underline{G}_1^{2N})_0 \text{ and } \frac{1}{2N} \cdot (\underline{X}^{2N} \circledast \underline{G}_1^{2N})_1$$

is needed for the first iteration of the iterative calculation of the circular convolution, one for the odd points and one for the even points. As the sum of the first few mutually complex conjugate frequency components of equation 3.8 is almost equivalent to the total sum of all mutually complex conjugate frequency components, there is no need to calculate $$\frac{1}{2N} \cdot (\underline{X}^{2N} \circledast \underline{G}_1^{2N})_0 \text{ and } \frac{1}{2N} \cdot (\underline{X}^{2N} \circledast \underline{G}_1^{2N})_1$$

based on all the coefficients of $$\underline{G}_1^{2N}.$$

Therefore we perform the initial calculation based upon the following calculation:

$$\frac{1}{2N} \cdot (\underline{X}^{2N} \circledast \underline{G}_1^{2N})_k \approx \frac{1}{2N} \cdot \sum_{i=0}^{Q} (\underline{X}^{2N})_{(k-i) \bmod 2N} (\underline{G}_1^{2N})_i. \quad (4.10)$$

In the calculation of $$\frac{1}{2N} \cdot (\underline{X}^{2N} \circledast \underline{G}_1^{2N})_0 (k = 0) \text{ and } \frac{1}{2N} (\underline{X}^{2N} \circledast \underline{G}_1^{2N})_1 (k = 1),$$

only 1 or 2 coefficients of $$\underline{G}_1^{2N}$$

need to be considered (i.e. Q=1,3) in order to get accurate results.

The factor $$\frac{a}{2} \cdot (m^1 - m^{-(N-1)})$$

in lemma 4.2.2 can be precalculated beforehand by the input-data $\underline{X}^{2N}$. As the multiplication with a can be performed elsewhere, as described in 4.2.2, the precalculation factor is $$\frac{1}{2} \cdot (m^1 - m^{-(N-1)}).$$

For large N, the pre-calculation is approximately m/2. m=2.166 results in a pre-calculation of 1.083. We can approximate this value by 1.0, resulting in a reduced complexity of 2N multiplications, without violating the condition $$(\underline{g}^{2N})_i \geq 0, \forall i.$$

The complexity of the iteration-steps can be reduced even further, as a multiplication by two can be performed by a shift operation. When using a precalculation of 1.0 and m=2, the constraint-window slightly drops below zero, thus violating the condition $$(\underline{g}^{2N})_i \geq 0, \text{ for } 0 \leq i < 2N.$$

As negative values in the constraint should be avoided, it is not advisable to use m=2. When we perform the iterative calculations with the pre-multiplication of 1.0, a single iteration in the convolution algorithm is done at the cost of two additions and one multiplication.

Because of the relation between $$\underline{G}_1^{2N} \text{ and } \underline{G}_2^{2N}$$

according to lemma 4.2.1, only the convolution with $\underline{G}_1$ need to be calculated. Also half of the output-points of $$\frac{1}{2N} \cdot (\underline{X}^{2N} \circledast \underline{G}^{2N})_k$$

need to be calculated, as the frequency-domain vectors are Hermitian.

Figure 7:
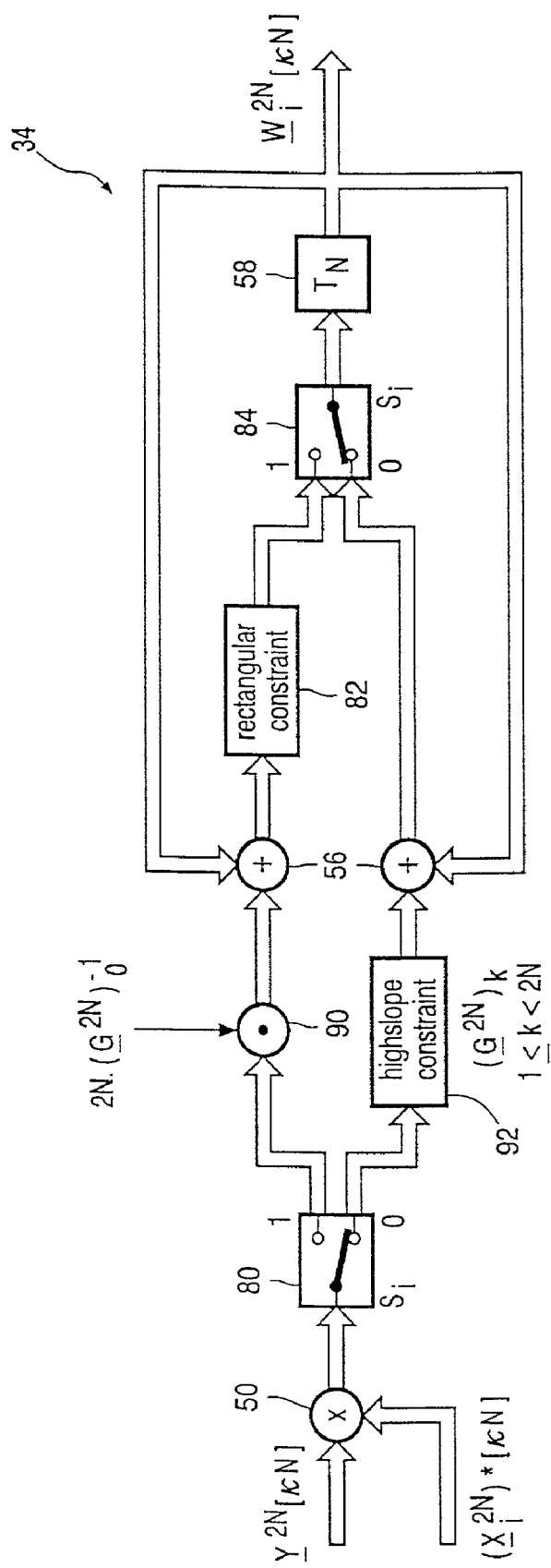

FIG. 7 shows an embodiment of the update block 34 in which an approximation of a rectangular constraint window 92, e.g. the high slope constraint window, is employed in combination with the rectangular constraint window or constraint means 82. The selection means comprise in this embodiment the approximation of a rectangular constraint window 92. The switches 80 and 84 control the operation of the update block 34. When both switches 80 and 84 are in the 1-position, the exact rectangular constraint window 82 is used to eliminate all the accumulated circular wrap-around artifacts. This exact rectangular constraint has a relatively high computational complexity and is performed only once in a while. When both switches 80 and 84 are in the 0-position, the approximation of the rectangular constraint window 92 is applied in order to eliminate a large part of the circular wrap-around artifacts in a computationally efficient way. In this way it is prevented that a too large accumulation of the circular wrap-around artifacts takes place, which would result in a relatively bad convergence behavior.

Experiments have shown that the PBFDAF as described in the above mentioned paper exhibits jumps in the convergence curve at the moments when the rectangular constraint 82 is applied: at these moments the NMSE is suddenly worse than before. Since the degradation in the NMSE occurs exactly after the moment that the rectangular constraint is applied, the removal of the circular-errors are responsible for this phenomenon. Apparently the accumulated circular-errors in the adaptive weights somehow contribute to the model of the room impulse response, and removing these circular-errors by means of rectangular constraining results in a temporarily degradation of the NMSE in the next block-iteration.

We start with an analysis, where we demonstrate that it is useful to compensate some of the wrap-around artifacts. This analysis is done by means of graphical construction of the convolution part in the adaptive filter. After this analysis we show how the compensation signals can be constructed.

$$\underline{z}_i^{2N}[\kappa N]$$

Figure 9:
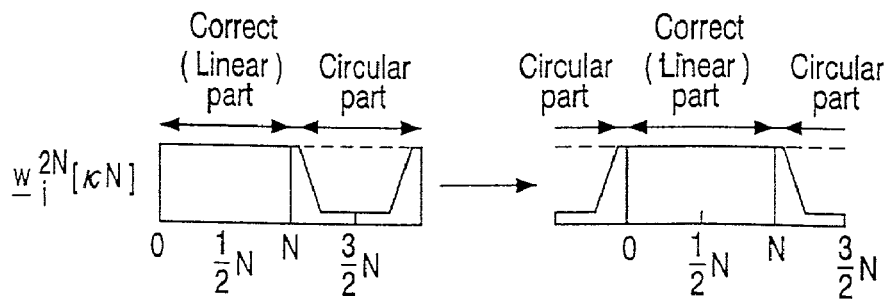

We can eliminate the temporarily degradation in the convergence curve of the known PBFDAF by compensating the removed circular-errors in the other partitions after a rectangular constraint is applied. As a result, the output of the partitioned convolution is approximately the same as when the constraint was not applied. For explaining this method, we consider FIG. 8 which shows the input-blocks in time-domain. After the circular correlation of the residual signal with the input signal blocks is performed, the result contains the wanted linear correlation in the range [0 . . . N−1], while the range [N . . . 2N−1] is polluted with circular wrap-around artifacts. In the full constrained PBFDAF all these wrap-around artifacts are eliminated. In this analysis we assume that the results near the correlation outputs N and 2N can be considered to approximate a linear correlation. In the PBFDAF without power normalization, this can be easily understood by correlating the residual signal in time-domain (augmented with N zeros) with the input signal blocks of FIG. 8. For the correlation output points higher but close to N, the amount of wrap-around artifacts is low. This is also true for the points lower but close to 2N. For correlation output points in the direction of 3N/2 the approximation gets worse as the amount of wrap-around artifacts increase. Therefore we refer the correlation output points higher but close to N as being the left tail and the points lower but close to 2N as being the right tail. As the right tail approximates the linear correlation for negative time lags, it is better to change the principal interval as is depicted in FIG. 9. As both tails are approximately results of a linear correlation, the coefficients of the tails in the adaptive weights $$\underline{w}_i^{2N}[\kappa N]$$

(in time-domain) converge to a value that is approximately correct. The tails of these adaptive weights can be successfully used for eliminating the temporarily degradation in the convergence curve of the known PBFDAF. On the other hand, the correlation results in the neighborhood of 3N/2 (with a high amount of wrap-around artifacts) are useless, due to the fact that there is an approximately 50% wrap-around between the two input blocks of length N. Hence, these correlation results have nothing to do with linear correlations. As these correlation results can be assumed random, the adaptive weights in the adaptive filter are also updated randomly. As a result, these parts in the adaptive weights are fluctuating and do not converge to a stable value. Therefore we refer these values in-between the two tails as the noisy part.

The circular wrap-around artifacts introduce errors in the convolution part of the adaptive filter, as neighbor partitions in this convolution are coupled. Because the two tails contain values that are approximate results of linear correlations, we can reuse these two tails on the moments where the rectangular constraint is applied in the known PBFDAF. This is done in such a way that the output of the block convolution in the adaptive filter remains approximately unchanged, while all circular wrap-around artifacts (i.e. the two tails and the noisy part) in that specific partition are eliminated. A method for achieving this, is by compensating the left tail into the next partition and compensating the right tail into the previous partition.

Figure 10:
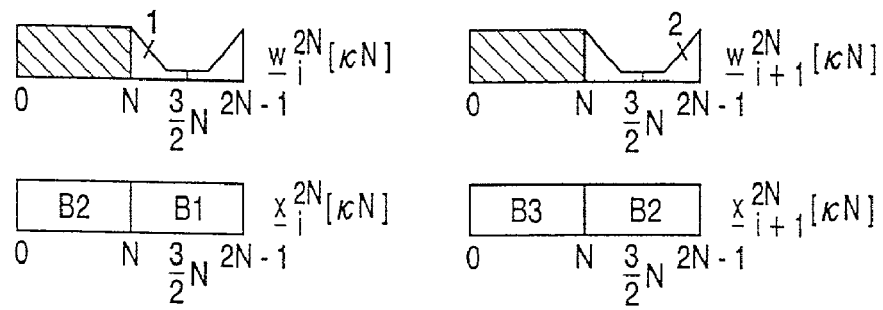

We explain the method of compensation graphically. In FIG. 10 we see the two weight vectors of the adaptive filter. For the adaptive weight vector $$\underline{w}_i^{2N}[\kappa N],$$

the left part represents the weights based on the correct linear correlations. The right side of this vector contains weights polluted with circular wrap-around artifacts. The weights are constructed out of the two tails as discussed earlier. The left tail is indicated with the number 1, while the right tail is indicated with number 2. In between these tails, the weights are noisy and therefore useless.

Figure 11:
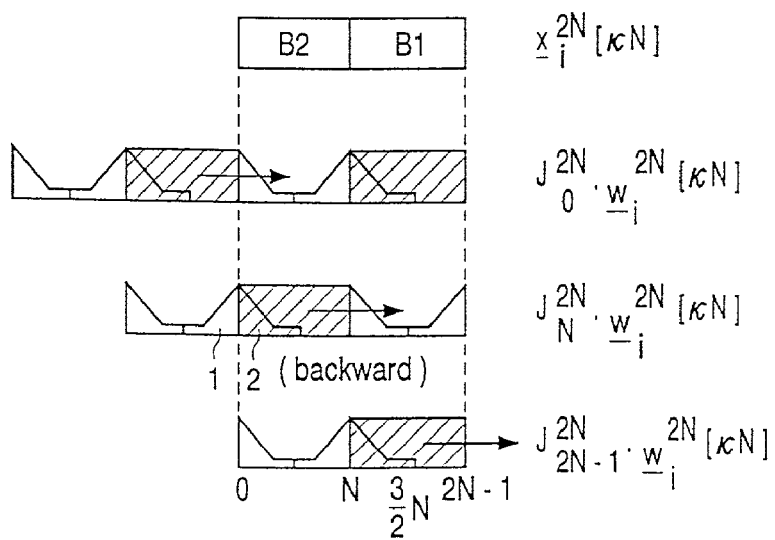

In the previous section we discussed the weights in the adaptive filter as being constructed out of results related with linear correlations and the circular wrap-around artifacts. It is also explained that a part of these wrap-around artifacts (the two tails) are useful results. The compensation discussed in this section explains how these tails can be reused. As we have two useful tails we can use them for a backward and a forward compensation. FIGS. 11 and 12 are used for explaining the forward and backward compensation.

The circular convolution of $$\underline{x}_i^{2N}[\kappa N] \text{ with } \underline{w}_i^{2N}[\kappa N]$$

can be performed graphically by mirroring one signal (e.g. the adaptive weights) and moving this signal to the right; this is indicated in FIG. 11. The total sum of products of both signals in one convolution-iteration is the output-element of that specific iteration. As we perform a circular convolution, shifting the adaptive weights is actually a rotation of the 2N length vector. The convolution output can be described by the following formula:

$$(\underline{x}_i^{2N}[\kappa N] \circledast \underline{w}_i^{2N}[\kappa N])_k = \sum_{m=0}^{2N-1} (\underline{x}_i^{2N}[\kappa N] \circledast (J_k^{2N} \cdot \underline{w}_i^{2N}[\kappa N]))_m. \quad (5.1)$$

In FIG. 11, three stages of graphical construction of the convolution-output are shown. We note that this figure shows the circular convolution in time-domain while in our efficient implementation, the circular-convolution is performed in frequency-domain.

In FIG. 1, we see the graphical construction of the correlation-output for k=0, N and 2N−1. The convolution-results of k=0 to k=N−1 don't play any role, as the window after the IFFT in the PBFDAF discards these points. For the points N to 2N−1 in $$\underline{w}_i^{2N}[\kappa N],$$

we see that convolution of tail 1 is largely concerned with input block B2. When we assume that this tail is small, this convolution can be approximated by the convolution of input block B2 with this tail in the next partition. This is achieved by removing tail 1 in the right side of the adaptive weights and placing this tail inside the first N points of the adaptive weight of the next partition, depicted in FIG. 12. We see that for small tails, the convolution output concerning the original tail 1 in this partition is approximately equal to the convolution output of this tail in the next partition.

On the other hand, we see that in FIG. 12 there is also a right tail indicated by the number 2. For the points N to 2N−1 of the convolution output, we see that the convolution of tail 2 is also largely concerned with block B2. For convolution outputs close to 2N−1, there is only a small wrap-around with block B3. Again, for small tails, this convolution of tail 2 with input block B2 can also be obtained (approximately) in the previous partition.

The destination of this tail 2 is depicted in FIG. 11. When the adaptive weights are shown with modified principal intervals as in FIG. 9, we can visualize the compensation in the partition i as shown in FIG. 13. We note that this works well for the middle K-2 partitions, but there are problems for the first and the last partition. This topic is discussed later.

FIG. 14 shows a block diagram of an embodiment of a generator means for generating forward and backward compensation signals and FIG. 15 shows some signal diagrams by means of which the operation of the generator means of FIG. 14 is explained. For every weight vector constrained with a rectangular constraint, the forward and backward compensation signals $$\underline{C}_{f_i}^{2N}[\kappa N] \text{ and } \underline{C}_{b_i}^{2N}[\kappa N]$$

are generated. For reasons of transparency, all signals are constructed in time-domain. If we consider the unconstrained weight-vector as consisting of a linear convolution part and tailed circular wrap-around artifacts, the signals 1 to 6 of FIG. 14 can be visualized as depicted in FIG. 15. A PBFDAF using this compensation has an improved convergence curve which does not have the large degradations in the NMSE on the moments that the exact rectangular constraint is performed. The positive effect of the compensation is clearly visible on the moments rectangular constraints are applied. The known PBFDAF shows large degradation in NMSE on these moments, whereas the compensated version shows an improvement. This improvement is due to the fact that the circular wrap-around artifacts are constrained to zero, while the useful information of the approximately linear correlation results is saved. Furthermore, the compensation of the circular-errors from one partition into the neighbor partitions has a positive effect on the convergence time-constant or CTC.

We compensate N/2 time-domain points out of the circular wrap-around artifacts into the next and N/2 time-domain points into the previous partition. Only a part of these N/2 points are approximately linear (i.e. the tails in the figures) and thus useful, while the points between the tails are polluted with artifacts that have approximately 50% wrap-around, and can be assumed to be noisy and useless. When we also compensate the noisy artifacts as depicted in FIG. 14, the steady-state NMSE is slightly worsened. A solution for this problem is not to compensate the noisy part and only compensate the two tails. For this purpose, the compensated alternative constraining method in combination with the use of sinusoid windows as an approximation of the rectangular constraint may be used. The sinusoid window constrain the noisy parts in the update, while two tails remain for the compensation.

Using an unconstrained PBFDAF, the convergence behavior is impaired and the region of convergence is smaller than with a fully constrained PBFDAF. When applying a sinusoid constraint approximation $g^{2N}$ in combination with the alternative constraining method, improved results are obtained, compared with the unconstrained PBFDAF. The sinusoid approximation constraint $g^{2N}$ is defined as:

$$(g^{2N})_i = \frac{1}{2}\left(1 + \sin\left(\frac{\pi \cdot i}{N}\right)\right) \cdot 0 \le i < 2N. \quad (5.2)$$

When applying sinusoid constraints, the noisy parts in the neighborhood of 3N/2 are reduced. On the other hand, the tails are not effectively reduced by the approximation constraint, but can be successfully compensated into the neighbor partitions with the method described in the previous section. The application of the rectangular windows of length N/2 in FIG. 14 requires two extra FFTs. This complexity can be reduced by replacing the rectangular windows by a raised cosine and an raised inverse cosine window, as indicated in FIG. 16. In FIG. 14 the selection means comprise window block 104 and/or window block 106.

FIG. 16 shows a block diagram of another embodiment of a generator means for generating forward and backward compensation signals and FIG. 17 shows some signal diagrams by means of which the operation of the generator means as shown in FIG. 16 is explained. Again all signals in are constructed in time-domain for transparency reasons. The raised cosine windows can be easily implemented in frequency-domain without the use of extra FFTs. The signals 1 to 6 are the same as in FIGS. 14 and 15 except that the noisy part is largely reduced by the sinusoid constraint approximations. The window for the backward compensation in the range N≦i<2N can be calculated by multiplying the sinusoid constraint window and the raised inverse cosine window. The window for the forward compensation can be calculated by multiplying the sinusoid constraint window and the raised cosine window. FIG. 18 shows the window for the backward compensation. FIG. 19 shows the window for the forward compensation. The selection means comprise here the combination of the sinusoid window and the raised cosine window (block 104) and/or the combination of the sinusoid window and the raised inverse cosine window (block 106).

In FIG. 20 we can see that the compensation leads to connections between the update blocks 34 of adjacent partitions. For the first partition, there is no compensation to the previous partition. For the last partition we omit the compensation to the next (non-existent) partition. Omitting this forward compensation for the last partition leads to removal of circular wrap-around artifacts which could be useful for modeling a higher order impulse response. The update blocks 34 in FIG. 20 exploit the compensation method as also explained in the previous section. The structure of these update blocks 34 is depicted in FIG. 21.

The sinusoid constraint 140 is placed before the coefficient update 142, while the rectangular constraint 150 is placed after the coefficient update 142, 144. The compensation signals are indicated with $\underline{C}_{f_i}^{2N}[\kappa N]$ (forward) and $\underline{C}_{b_i}^{2N}[\kappa N]$ (backward).

When no rectangular constraint is applied the compensation signals are omitted (i.e. state 0 of the switches 146, 148, 152, 154). A linear way of rectangular constraining is applied, where the switches 146, 148, 152, 154 are described by the following formula:

$$S_i = \begin{cases} 1 & \text{if } \kappa \bmod (KP) = i \\ 0 & \text{otherwise.} \end{cases} \quad (5.3)$$

The use of an approximation constraint when also a rectangular constraint is applied seems to be needless. However, the compensation after applying a rectangular constraint also compensates the extra noise in the wrap-around artifacts (due to the omitting of the sinusoid constraint). Hence this leads to degradation in convergence behavior. Therefore it is preferred to also apply the approximation constraint when applying of a rectangular constraint with the compensation (see FIG. 21).

When implementing the rectangular constraint together with the compensation, we need additional computational complexity for the compensation part. This is because of the need of splitting up the two tails for the compensation in the next and previous partition and doing a time-domain shift of the two individual tails. A direct implementation as in FIG. 14 is possible, but needs an abundant amount of extra computational complexity as all operations are performed in time-domain. A more efficient implementation can be obtained when generating the signals in frequency-domain. The shift in the time-domain is a N point shift of a 2N point signal $\underline{h}_1^{2N}$, resulting in the 2N point signal $\underline{h}_2^{2N}$.

In frequency-domain these signals are represented by $\underline{H}_1^{2N}$ and $\underline{H}_2^{2N}$ respectively. This shift can be easily implemented in the frequency-domain via lemma 5.3.1 which uses the shift-theorem.

Lemma 5.3.1 If $\underline{h}_2^{2N} = \underline{D}_N^{2N} \cdot \underline{h}_1^{2N}$ then:

$$(\underline{H}_2^{2N})_k = \begin{cases} +(\underline{H}_1^{2N})_k & \text{for } k \text{ even} \\ -(\underline{H}_1^{2N})_k & \text{for } k \text{ odd.} \end{cases} \quad (5.4)$$

The generation of the time-domain signals 2, 3 and 4 of FIG. 14 can be easily calculated in frequency-domain. FIG. 22 shows this efficient implementation. We note that $(\underline{-1}^{2N})_i = (-1)^i$.

The elementwise multiplication of a frequency domain vector by this vector implements the time-domain shift of N points. As the compensation signals need to be added to the neighbor partitions, these elementwise multiplications by −1 and 1 can be omitted if we use both additions and subtractions. The raised cosine window is now applied in frequency-domain. The other (raised inverse cosine window) is calculated by simple subtraction operations and saves computational complexity. It is also noted that the multiplications by ½ and j/4 can be implemented as simple shift operations.

We already mentioned that it is not possible to perform the forward compensation in the last partition. Usually the circular wrap-around artifacts of this left tail are nulled by the rectangular constraint. As the wrap-around artifacts of this tail can be used for a higher order (>KN) adaptive filter, we could leave this tail unconstrained. The implementation of the compensation in the last partition is depicted in FIG. 23. We note that the computational complexity of this implementation is slightly lower compared to the implementation of FIG. 22.

In the embodiments of FIGS. 22 and 23, the selection means comprise the IFFT 160, zero appender 162, FFT 164 and the convolution block 168.

We already mentioned that the first partition in the PBFDAF does not retrieve a forward compensation signal from its predecessor partition, and the first partition does not have to generate a backward compensation signal. Hence the implementation of the update-block in the first partition can also be implemented with reduced computational complexity.

Good constraint approximations for the Partitioned BFDAF algorithm do not result in a near-optimal convergence behavior compared with the fully constrained PBFDAF. This is caused by unconstrained circular wrap-around artifacts, which are accumulated in the weight-update and cause problems in the convolution part of the PBFDAF as the different partitions are coupled. When combining the constraint approximations with the Alternative constraining mechanism, we get an improvement, but still achieve non-optimal convergence behavior. A specific part of the accumulated wrap-around artifacts not removed by the constraint approximations are removed once in a while with the Alternative constraining mechanism. This specific part are approximately results of a linear correlation, that can be successfully reused (compensated) in the neighbor partitions. When we combine this method of compensation with the simplest form of constraint approximations (i.e. sinusoid constraint), we get a near-optimal convergence behavior compared to the fully constrained PBFDAF, while obtaining an enormous reduction in computational complexity. For four and more partitions, the number of operations of the PBFDAF is reduced by a factor two. Simulations show that the performance of this constraining mechanism is also very good for highly correlated, non-stationary input signals.

The PBFDAF according to the invention may be implemented in hardware, in software or in a combination of both. Preferably, a digital signal processor is used to implement the PBFDAF according to the invention.

The scope of the invention is not limited to the embodiments explicitly disclosed. The invention is embodied in each new characteristic and each combination of characteristics. Any reference signs do not limit the scope of the claims. The word "comprising" does not exclude the presence of other elements or steps than those listed in a claim. Use of the word "a" or "an" preceding an element does not exclude the presence of a plurality of such elements.

Table of Symbols and Formulas

| | |
|---|---|
| $a$ | Mean value for constraint approximations. |
| $\alpha$ | Adaptation constant. |
| $A_i$ | Update block for partition i. |
| $\mathcal{A}\{\cdot\}$ | Number of additions. |
| $\underline{C}_{b_i}[\kappa N]$ | Backward compensation signal from partition i. |

-continued

Table of Symbols and Formulas

| | |
|---|---|
| $\underline{C}_{f_i}[\kappa N]$ | Forward compensation signal from partition i. |
| $D_N^{2N}$ | Rotation matrix. |
| $\mathcal{D}\{\cdot\}$ | Number of divisions. |
| $e[k]$ | Desired signal (echo in AEC). |
| $\hat{e}[k]$ | Estimate of the desired signal. |
| $\overline{e}[k]$ | Desired signal corrupted with $s[k]$. |
| $\mathcal{F}$ | Fourier transform matrix. |
| $\underline{G}^{2N}$ | Generalised constraint window. |
| $\underline{\nabla}[k]$ | Stochastic gradient vector. |
| $\underline{h}[k]$ | Impulse response vector. |
| $I^N$ | Identity matrix. |
| $j$ | Imaginary unit. |
| $J^N$ | Mirror matrix. |
| $K$ | Number of partitions in the PBFDAF algorithm. |
| $K_i$ | Threshold partition for Hybrid constrained PBFDAF. |
| $\kappa$ | Block time index. |
| $m$ | Multiplicative factor for high-slope constraint approximation. |
| $\mathcal{M}\{\cdot\}$ | Number of real multiplications. |
| $\Theta$ | Memory occupation. |
| $N$ | Block length. |
| $\underline{0}, O$ | All zero vector, matrix. |
| $P$ | Alternating constraint period. |
| $\underline{P}_x[k]$ | Normalisation (power) vector. |
| $\underline{\hat{P}}_x[k]$ | Estimate of $\underline{P}_x$. |
| $\psi$ | Computational complexity measure. |
| $r[k]$ | Residual signal. |
| $s[k]$ | Near-end signal. |

We claim:

1. A partitioned block frequency domain adaptive filter for filtering an input signal in dependence on a control signal, the adaptive filter comprising a plurality of parallel arranged filter partitions, each filter partition being arranged for modeling a part of an impulse response of the adaptive filter, each filter partition having update means for updating filter coefficients of that filter partition by circular convoluting a signal representative of the input signal and a signal representative of the control signal, the update means comprising constraint means for intermittently constraining the filter coefficients by eliminating circular wrap-around artifacts of the circular convolution, characterized in that the update means further comprise selection means for selecting and removing at least part of the circular wrap-around artifacts, the selection means comprising an approximation of a rectangular constraint window.

2. The partitioned block frequency domain adaptive filter according to claim 1, characterized in that the selection means are arranged for selecting the at least part of the circular wrap-around artifacts when the filter coefficients are not constrained by the constraint means.

3. The partitioned block frequency domain adaptive filter according to claim 1 or 2, characterized in that time domain values of the approximation are larger than or equal to zero.

4. The partitioned block frequency domain adaptive filter according to any one of the claims 1 to 3, characterized in that the approximation in time domain has substantially high slopes near the positions which correspond to the positions of the transitions in a rectangular constraint window.

5. The partitioned block frequency domain adaptive filter according to any one of claims 1 to 4, characterized in that frequency domain values of the approximation each comprise a real value and complex conjugate imaginary values, whereby at least part of the imaginary values form a row of numbers, the numbers being obtainable from one another by multiplication.

6. The partitioned block frequency domain adaptive filter according to claim 5, characterized in that the frequency domain values of the approximation are defined as:

$$(G^{2N})_i = \begin{cases} 2N \cdot a & \text{for } i = 0 \\ 0 & \text{for } 0 < i < 2N, i \text{ even} \\ -\frac{2N \cdot a}{2}\left(m^{-\left(\frac{i-1}{2}\right)} - m^{-\left(\frac{2N-1-i}{2}\right)}\right)j & \text{for } 0 \leq i < 2N, i \text{ odd} \end{cases}$$

with i being an index number, m being a multiplication factor, a being a mean value.

7. The partitioned block frequency domain adaptive filter according to claim 6, characterized in that m is substantially equal to 2.166.

8. An acoustic echo canceller comprising a partitioned block frequency domain adaptive filter for filtering an input signal in dependence on a control signal, the adaptive filter comprising a plurality of parallel arranged filter partitions, each filter partition being arranged for modeling a part of an impulse response of the adaptive filter, each filter partition having update means for updating filter coefficients of that filter partition by circular convoluting a signal representative of the input signal and a signal representative of the control signal, the update means comprising constraint means for intermittently constraining the filter coefficients by eliminating circular wrap-around artifacts of the circular convolution, characterized in that the update means further comprise selection means for selecting and removing at least part of the circular wrap-around artifacts, the selection means comprising an approximation of a rectangular constraint window.

9. The acoustic echo canceller according to claim 8, characterized in that the selection means are arranged for selecting the at least part of the circular wrap-around artifacts when the filter coefficients are not constrained by the constraint means.

10. The acoustic echo canceller according to claim 8 or 9, characterized in that time domain values of the approximation are larger than or equal to zero.

11. The acoustic echo canceller according to any one of the claims 8 to 10, characterized in that the approximation in time domain has substantially high slopes near the positions which correspond to the positions of the transitions in a rectangular constraint window.

12. The acoustic echo canceller according to any one of claims 8 to 11, characterized in that frequency domain values of the approximation each comprise a real value and complex conjugate imaginary values, whereby at least part of the imaginary values form a row of numbers, the numbers being obtainable from one another by multiplication.

13. The acoustic echo canceller according to claim 12, characterized in that the frequency domain values of the approximation are defined as:

$$(G^{2N})_i = \begin{cases} 2N \cdot a & \text{for } i = 0 \\ 0 & \text{for } 0 < i < 2N, i \text{ even} \\ -\frac{2N - a}{2}\left(m^{-\left(\frac{i-1}{2}\right)} - m^{-\left(\frac{2N-1-i}{2}\right)}\right)j & \text{for } 0 \leq i < 2N, i \text{ odd} \end{cases}$$

with i being an index number, m being a multiplication factor, a being a mean value.

14. The acoustic echo canceller according to claim 13, characterized in that m is substantially equal to 2.166.

15. A method of adaptively filtering an input signal in dependence on a control signal, the method comprising the steps of:
partitioning the input signal into partitions,
for each partition updating filter coefficients by circular convoluting a signal representative of the input signal and a signal representative of the control signal,
for each partition intermittently constraining the filter coefficients by eliminating circular wrap-around artifacts of the circular convolution, characterized in that the method further comprises the step of selecting and removing at least part of the circular wrap-around artifacts by means of an approximation of a rectangular constraint window.

16. The method according to claim 15, characterized in that the selection of the at least part of the circular wrap-around artifacts is performed only when the filter coefficients are not constrained by the constraint means.

17. The method according to claim 15 or 16, characterized in that time domain values of the approximation are larger than or equal to zero.

18. The method according to any one of the claims 15 to 17, characterized in that the approximation in time domain has substantially high slopes near the positions which correspond to the positions of the transitions in a rectangular constraint window.

19. The method according to any one of claims 15 to 18, characterized in that frequency domain values of the approximation each comprise a real value and/or an imaginary value and/or a conjugate imaginary value, whereby at least part of the imaginary values form a row of numbers, the numbers being obtainable from one another by multiplication.

20. The method according to claim 19, characterized in that the frequency domain $$(G^{2N})_i = \begin{cases} 2N \cdot a & \text{for } i = 0 \\ 0 & \text{for } 0 < i < 2N, i \text{ even} \\ -\frac{2N - a}{2}\left(m^{-\left(\frac{i-1}{2}\right)} - m^{-\left(\frac{2N-1-i}{2}\right)}\right)j & \text{for } 0 \leq i < 2N, i \text{ odd} \end{cases}$$

values of the approximation are defined as:
with i being an index number, m being a multiplication factor, a being a mean value.

21. The partitioned block frequency domain adaptive filter according to claim 20, characterized in that m is substantially equal to 2.166.

* * * * *